(12) United States Patent  (10) Patent No.: US 8,963,571 B2
Cheng  (45) Date of Patent: Feb. 24, 2015

(54) INSPECTION DEVICE FOR GLASS SUBSTRATE

(75) Inventor: Wen-da Cheng, Shenzhen (CN)

(73) Assignee: Shenzhen China Star Optoelectronics Technology Co., Ltd., Guangdong (CN)

( * ) Notice: Subject to any disclaimer, the term of this patent is extended or adjusted under 35 U.S.C. 154(b) by 514 days.

(21) Appl. No.: 13/375,715

(22) PCT Filed: Sep. 7, 2011

(86) PCT No.: PCT/CN2011/079422
§ 371 (c)(1),
(2), (4) Date: Dec. 1, 2011

(87) PCT Pub. No.: WO2013/026217
PCT Pub. Date: Feb. 28, 2013

(65) Prior Publication Data
US 2013/0049785 A1  Feb. 28, 2013

(30) Foreign Application Priority Data
Aug. 24, 2011 (CN) .......................... 2011 1 0248267

(51) Int. Cl.
G01R 1/067 (2006.01)
G09G 3/00 (2006.01)

(52) U.S. Cl.
CPC .................................... *G09G 3/006* (2013.01)
USPC ...... 324/755.05; 324/158; 324/754; 324/755; 324/756

(58) Field of Classification Search
CPC .......... G01R 31/00; G01R 1/067; G01R 1/06; G01R 1/073

USPC ........ 324/755.01, 755.05, 156, 754–756, 158
See application file for complete search history.

(56) References Cited

U.S. PATENT DOCUMENTS

| 5,124,646 | A | * | 6/1992 | Shiraishi ................... 324/756.03 |
| 7,073,252 | B1 | * | 7/2006 | Hertz et al. ...................... 29/829 |
| 7,116,123 | B2 | * | 10/2006 | Goto ......................... 324/755.05 |
| 2011/0121850 | A1 | * | 5/2011 | Lee ........................... 324/756.02 |

FOREIGN PATENT DOCUMENTS

| CN | 2371564 | Y | 3/2000 | |
| CN | 2632683 | | * 8/2004 | ............. G01R 1/067 |
| CN | 2632683 | Y | 8/2004 | |
| CN | 2722254 | Y | 8/2005 | |
| CN | 1763550 | A | 4/2006 | |
| CN | 101334425 | A | 12/2008 | |
| CN | 101363873 | A | 2/2009 | |
| CN | 201262642 | | * 6/2009 | ............. G01R 31/28 |
| CN | 201262642 | Y | 6/2009 | |
| CN | 201429965 | Y | 3/2010 | |
| CN | 201549181 | U | 8/2010 | |
| CN | 202256602 | U | 5/2012 | |
| JP | 11344536 | A | 12/1999 | |
| JP | 2011085496 | A | 4/2011 | |
| TW | 357264 | A | 5/1999 | |

* cited by examiner

*Primary Examiner* — Arleen M Vazquez
*Assistant Examiner* — Neel Shah
(74) *Attorney, Agent, or Firm* — Sughrue Mion, PLLC

(57) ABSTRACT

Disclosed is an inspection device for a glass substrate, comprising at least one probe, a holder, a stretch controller and a control circuit. The probe is installed on the stretch controller, the stretch controller is employed to stretch the probe out of the holder as an electrical signal is received; and to retract the probe backward in the holder as the electrical signal stops. The present invention promotes the inspection efficiency for the glass substrate.

14 Claims, 2 Drawing Sheets

INSPECTION DEVICE FOR GLASS SUBSTRATE

BACKGROUND OF THE INVENTION

1. Field of the Invention

The present invention generally relates to a LCD technology field, and more particularly to an inspection device for a glass substrate.

2. Description of Prior Art

In manufacture processes of LCDs, an inspection is required for the glass substrate.

Please refer to FIG. 1A and FIG. 1B, which show diagrams of an inspection device for a glass substrate according to prior art.

The device comprises holder 101 and probes 102. As the inspection of the glass substrate is proceeding, the probes 102 are inserted into pads (not shown) of the glass substrate, and voltages are inputted through the holder 101. The voltages are inputted into the glass substrate through the probes on the holder 101 for inspection.

However, the probes 102 are fixed on the holder 101 according to prior art, the process station needs to be down for setting up the proper probes once the number of the probes 102 does not match with the number of the pads on the glass substrate. For example, the unnecessary probes 102 are removed or the necessary extra probes are plugged into the holder 101. Please refer to FIG. 1B, the number of the pads on the glass substrate is seven and the number of the probes 102 on the holder 101 is fourteen, hypothetically. The process station needs to be down for removing the seven unnecessary probes 102 shown in FIG. 1A to have the structure shown in FIG. 1B.

In conclusion, the process station needs to be down for setting up probes before the inspection proceeds. More time should be spent. The inspection efficiency for the glass substrate is decreased and the productivity is lowered.

SUMMARY OF THE INVENTION

An objective of the present invention is to provide an inspection device for a glass substrate to solve the technical issue that the process station needs to be down for setting up probes before the inspection proceeds in the prior art. The technical issue not only spends more time to decrease the inspection efficiency for the glass substrate and also lowers productivity.

For solving the aforesaid issues, the present invention provides an inspection device for a glass substrate, comprising at least one probe and a holder. The inspection device for the glass substrate further comprises a stretch controller and a control circuit, and the probe is installed on the stretch controller, the stretch controller is employed to stretch the probe out of the holder as an electrical signal is received; and to retract the probe backward in the holder as the electrical signal stops;

the control circuit is employed to input or not input the electrical signal to the stretch controller.

In the inspection device for the glass substrate according to the present invention, the stretch controller comprises a movable control base, a stretch control component and a retract control component, and the movable control base is fixedly connected with the probe;

the stretch control component is employed to move the movable control base for stretching the probe out of the holder as the electrical signal is received;

the retract control component is employed to move the movable control base for retracting the probe backward in the holder.

In the inspection device for the glass substrate according to the present invention, the stretch control component comprises a first electromagnetic component and a second electromagnetic component, the first electromagnetic component is positioned on the movable control base and the second electromagnetic component is positioned on the holder;

the first electromagnetic component and the second electromagnetic component attract with each other to move the movable control base for stretching the probe out of the holder as the electrical signal is received.

In the inspection device for the glass substrate according to the present invention, the retract control component is a spring structure.

In the inspection device for the glass substrate according to the present invention, an attractive force between the first electromagnetic component and the second electromagnetic component as the electrical signal is received is larger than a maximum spring force of the spring structure.

The inspection device for the glass substrate according to the present invention further comprises at least one wire and the wire is electrically connected to the first electromagnetic component.

The inspection device for the glass substrate according to the present invention further comprises top cover and the top cover is employed for holding the wire.

In the inspection device for the glass substrate according to the present invention, the top cover is a print circuit board, and the print circuit board comprises the control circuit.

Another objective of the present invention is to provide an inspection device for a glass substrate to solve the technical issue that the process station needs to be down for setting up probes before the inspection proceeds in the prior art. The technical issue not only spends more time to decrease the inspection efficiency for the glass substrate and also lowers productivity.

For solving the aforesaid issues, the present invention provides an inspection device for a glass substrate, comprising at least one probe and a holder, characterized in that the inspection device of the glass substrate further comprises a stretch controller and a control circuit, and the probe is installed on the stretch controller, the stretch controller is employed to stretch the probe out of the holder as an electrical signal is received; and to retract the probe backward in the holder as the electrical signal stops.

In the inspection device for the glass substrate according to the present invention, the stretch controller comprises a movable control base, a stretch control component and a retract control component, and the movable control base is fixedly connected with the probe;

the stretch control component is employed to move the movable control base for stretching the probe out of the holder as the electrical signal is received;

the retract control component is employed to move the movable control base for retracting the probe backward in the holder.

In the inspection device for the glass substrate according to the present invention, the stretch control component comprises a first electromagnetic component and a second electromagnetic component, the first electromagnetic component is positioned on the movable control base and the second electromagnetic component is positioned on the holder;

the first electromagnetic component and the second electromagnetic component attract with each other to move the movable control base for stretching the probe out of the holder as the electrical signal is received.

In the inspection device for the glass substrate according to the present invention, the retract control component is a spring structure.

In the inspection device for the glass substrate according to the present invention, an attractive force between the first electromagnetic component and the second electromagnetic component as the electrical signal is received is larger than a maximum spring force of the spring structure.

The inspection device for the glass substrate according to the present invention further comprises at least one wire and the wire is electrically connected to the first electromagnetic component.

The inspection device for the glass substrate according to the present invention further comprises a top cover and the top cover is employed for holding the wire.

The inspection device for the glass substrate according to the present invention further comprises a control circuit and the control circuit is employed to input or not input the electrical signal to the wire.

The inspection device for the glass substrate according to the present invention further comprises a top cover and the top cover is a print circuit board.

In the inspection device for the glass substrate according to the present invention, the print circuit board comprises the control circuit to input or not input the electrical signal to the wire.

Comparing with the prior art, the present invention solve the technical issue that the process station needs to be down for setting up probes before the inspection proceeds in prior art. The technical issue spends more time and decreases the inspection efficiency. The present invention is capable of raising the productivity.

For a better understanding of the aforementioned content of the present invention, preferable embodiments are illustrated in accordance with the attached figures for further explanation:

BRIEF DESCRIPTION OF THE DRAWINGS

FIG. 4 shows a diagram of operation situation of the inspection device for the glass substrate in FIG. 2.

DETAILED DESCRIPTION OF THE INVENTION

The following descriptions for the respective embodiments are specific embodiments capable of being implemented for illustrations of the present invention with referring to appended figures.

Figure 1A:
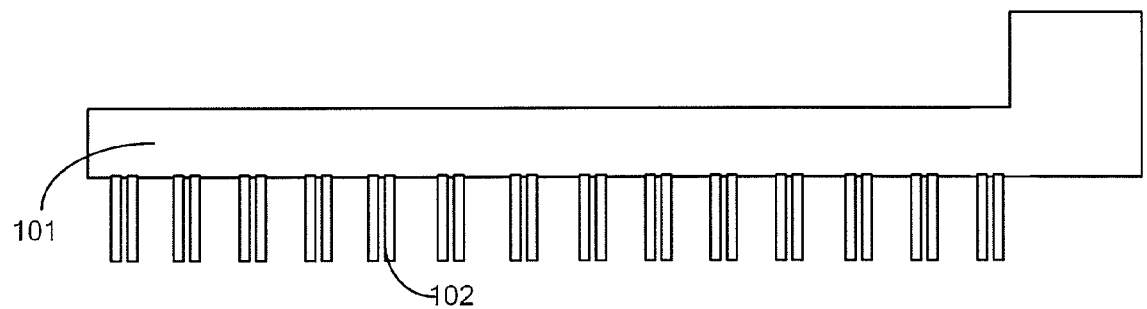
FIG. 1A and FIG. 1B show diagrams of an inspection device for a glass substrate according to a prior art.
Figure 1B:
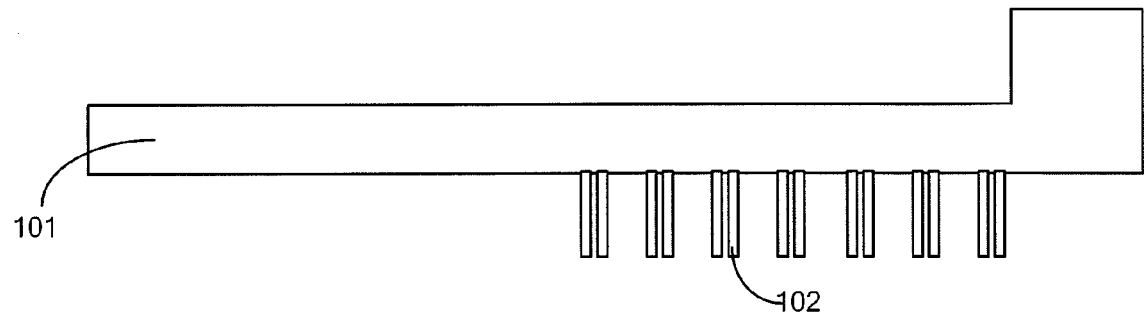
Figure 2:
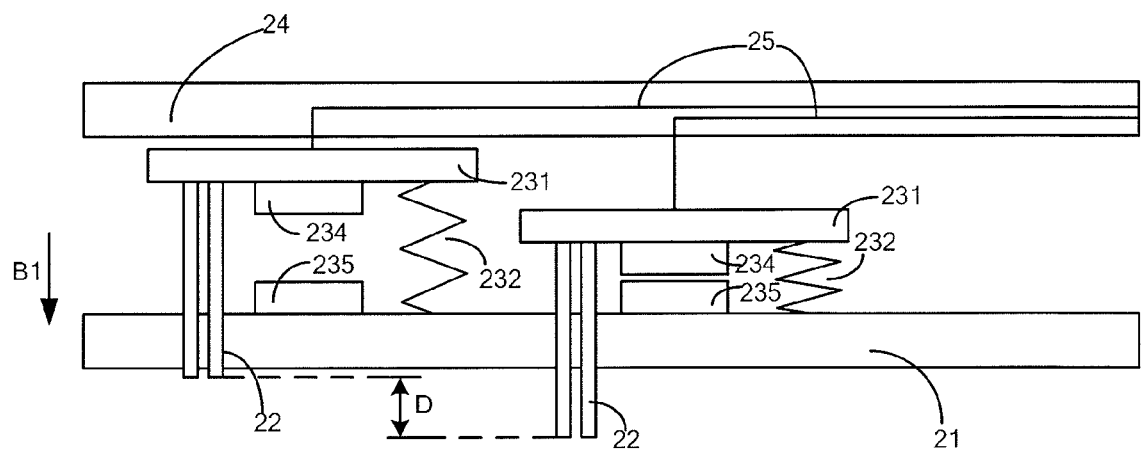
FIG. 2 shows an inspection device for a glass substrate according to a preferable embodiment of the present invention.
Figure 3:
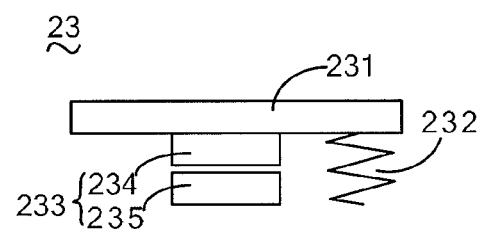
FIG. 3 shows a structure diagram of a stretch controller in FIG. 2.

Please refer to FIG. 2 and FIG. 3. FIG. 2 shows an inspection device for a glass substrate according to a preferable embodiment of the present invention. The inspection device for the glass substrate comprises a holder 21, a plurality of probes 22, a plurality of stretch controller 23 (in FIG. 3), a top cover 24 and a plurality of wires. Each of the stretch controllers 23 corresponds to one probe 22. The stretch controller 23 control the probe 22 to move along the predetermined direction B1 to stretch the probe 22 out of the holder 21. The stretch controller 23 also can control the probe 22 to move along the reverse direction of B1 to retract the probe 22 backward in the holder 21. The direction B1 is the direction that the probe 22 is inserted into the glass substrate (not shown) for inspection.

Please refer to FIG. 3, which shows a structure diagram of the stretch controller 23 in FIG. 2. The stretch controller 23 comprises a movable control base 231, a stretch control component 233 and a retract control component 232. The movable control base 231 is fixedly connected with the probe 22.

Please refer to FIG. 3. The stretch control component 233 comprises a first electromagnetic component 234 and a second electromagnetic component 235. The first electromagnetic component 234 is positioned on the movable control base 231 and the second electromagnetic component is positioned on the holder 21. In an exemplary embodiment, the stretch control component 233 can be other structures as long as the structure is capable of moving the probe 22 with a predetermined distance D along the direction B1. As the probes 22 are moved with the predetermined distance D along the direction B1, the probes 22 are inserted into the glass substrate.

In the embodiment shown in FIG. 2, the retract control component 232 is an elastic element and preferable a spring structure. Other structure also can be considered as long as the structure can move the probe 22 with the predetermined distance D along the reverse direction B2 of the direction B1.

The top cover 24 is employed for holding the wires 25. A control circuit (not shown) inputs or not inputs of an electrical signal to the wires 25. The wires 25 are electrically connected to the first electromagnetic components 234. After the control circuit inputs the electrical signal, attractive force between the first electromagnetic component 234 and the second electromagnetic component 235 is larger than a maximum spring force of the retract control component 232. Therefore, the stretch control component 233 is capable of moving the probe 22 with the predetermined distance D along the direction B1.

Alternatively, the top cover 24 has a print circuit board. The print circuit board comprises the control circuit (not shown). The control circuit is electrically connected to the wires 25 and input or not input the electrical signal to the wires 25 for controlling the first electromagnetic component 234 and the second electromagnetic component 235.

The working principle of the preferable embodiment shown in FIG. 2 is introduced hereafter:

Please refer to FIG. 3 and FIG. 4. As the inspection for the glass substrate is proceeding, the number of the pads on the glass substrate is seven, hypothetically. The number of the probes 22 of the inspection device for the glass substrate according to the present invention is fourteen. According to the positions of the pads, the control unit controls the wires 25 corresponding to the seven probes 22 at the right side shown in FIG. 4 to be electrified (also referring to FIG. 2). After the wires 25 are electrified, the first electromagnetic component 234 receives the electrical signal and attracts the second electromagnetic component 235. Because, the attractive force between the first electromagnetic component 234 and the second electromagnetic component 235 is larger than a maximum spring force of the retract control component 232. Therefore, the movable control base 231 is moved with the predetermined distance D along the predetermined direction B1 to stretch the probe 22 fixed on the movable control base 231 out of the holder 21 with the predetermined distance D along the predetermined direction B1. The probe 22 is inserted into the glass substrate for inspection.

Meanwhile, the control unit controls the wires 25 corresponding to the seven probes 22 at the left side shown in FIG.

4 to be not electrified (also referring to FIG. 2). The first electromagnetic components 234 corresponding to the probes 22 (No. 1-No. 7) do not receive the electrical signal and will not attract the second electromagnetic components 235. The retract control component 232 controls the movable control base 231 to move with the predetermined distance D along the reverse direction B2 of the direction B1 to retract the probe 22 backward in the holder 21.

According to the present invention, the process station has no need to be down for setting up the probes 22 but the probes 22 corresponding to the number of the pads on the glass substrate for inspection can be flexibly stretched or retracted and tremendously promote the inspection efficiency.

As is understood by a person skilled in the art, the foregoing preferred embodiments of the present invention are illustrative rather than limiting of the present invention. It is intended that they cover various modifications and similar arrangements be included within the spirit and scope of the appended claims, the scope of which should be accorded the broadest interpretation so as to encompass all such modifications and similar structure.

What is claimed is:

1. An inspection device for a glass substrate, comprising at least one probe and a holder, characterized in that the inspection device for the glass substrate further comprises a stretch controller and a control circuit, and one end portion of the probe is installed on the stretch controller, the other end portion of the probe is inserted through the holder,
   the stretch controller is employed to stretch the probe out of the holder as an electrical signal is received; and to retract the probe backward in the holder as the electrical signal stops;
   the control circuit is employed to input or not input the electrical signal to the stretch controller;
   the stretch controller comprises a movable control base, a stretch control component and a retract control component, and the movable control base is connected with and fixed to the probe;
   the stretch control component is employed to move the movable control base for stretching the probe out of the holder as the electrical signal is received;
   the retract control component is employed to move the movable control base for retracting the probe backward in the holder; and
   wherein the stretch control component comprises a first electromagnetic component and a second electromagnetic component,
   the first electromagnetic component is positioned on the movable control base and the second electromagnetic component is positioned on the holder;
   the first electromagnetic component and the second electromagnetic component attract with each other to move the movable control base for stretching the probe out of the holder as the electrical signal is received.

2. The inspection device for the glass substrate according to claim 1, characterized in that the retract control component is a spring structure.

3. The inspection device for the glass substrate according to claim 2, characterized in that an attractive force between the first electromagnetic component and the second electromagnetic component as the electrical signal is received is larger than a maximum spring force of the spring structure.

4. The inspection device for the glass substrate according to claim 1, characterized in further comprising at least one wire, and the wire is electrically connected to the first electromagnetic component.

5. The inspection device for the glass substrate according to claim 4, characterized in further comprising a top cover and the top cover is employed for holding the wire.

6. The inspection device for the glass substrate according to claim 1, characterized in further comprising a top cover and the top cover is a print circuit board, and the print circuit board comprises the control circuit.

7. An inspection device for a glass substrate, comprising at least one probe and a holder, characterized in that the inspection device for the glass substrate further comprises a stretch controller and a control circuit, and one end portion of the probe is installed on the stretch controller, the other end portion of the probe is inserted through the holder,
   the stretch controller is employed to stretch the probe out of the holder as an electrical signal is received; and
   to retract the probe backward in the holder as the electrical signal stops;
   the stretch controller comprises a movable control base, a stretch control component and a retract control component, and the movable control base is connected with and fixed to the probe;
   the stretch control component is employed to move the movable control base for stretching the probe out of the holder as the electrical signal is received;
   the retract control component is employed to move the movable control base for retracting the probe backward in the holder; and
   wherein the stretch control component comprises a first electromagnetic component and a second electromagnetic component,
   the first electromagnetic component is positioned on the movable control base and the second electromagnetic component is positioned on the holder;
   the first electromagnetic component and the second electromagnetic component attract with each other to move the movable control base for stretching the probe out of the holder as the electrical signal is received.

8. The inspection device for the glass substrate according to claim 7, characterized in that the retract control component is a spring structure.

9. The inspection device for the glass substrate according to claim 8, characterized in that an attractive force between the first electromagnetic component and the second electromagnetic component as the electrical signal is received is larger than a maximum spring force of the spring structure.

10. The inspection device for the glass substrate according to claim 7, characterized in further comprising at least one wire and the wire is electrically connected to the first electromagnetic component.

11. The inspection device for the glass substrate according to claim 10, characterized in further comprising a top cover and the top cover is employed for holding the wire.

12. The inspection device for the glass substrate according to claim 10 characterized in further comprising a control circuit and the control circuit is employed to input or not input the electrical signal to the wire.

13. The inspection device for the glass substrate according to claim 10, characterized in further comprising a top cover and the top cover is a print circuit board.

14. The inspection device for the glass substrate according to claim 13, characterized in that the print circuit board comprises the control circuit to input or not input the electrical signal to the wire.

* * * * *